(12) United States Patent
Rajagopalan et al.

(10) Patent No.: US 7,041,516 B2
(45) Date of Patent: May 9, 2006

(54) MULTI CHIP MODULE ASSEMBLY

(75) Inventors: Sarathy Rajagopalan, Milpitas, CA (US); Kishor Desai, Fremont, CA (US); John P. McCormick, Palo Alto, CA (US); Maniam Alagaratnam, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/268,361

(22) Filed: Oct. 10, 2002

(65) Prior Publication Data

US 2004/0072377 A1  Apr. 15, 2004

(51) Int. Cl.
*H01L 21/50* (2006.01)
*G01R 31/26* (2006.01)

(52) U.S. Cl. .......................... 438/15; 438/17; 438/108; 438/107; 438/127

(58) Field of Classification Search ................ 438/107, 438/108, 110, 119, 112, 122, 124, 127, 15, 438/17, 25, 26
See application file for complete search history.

(56) References Cited

U.S. PATENT DOCUMENTS

| 5,137,836 | A | * | 8/1992 | Lam .............................. 438/15 |
| 5,191,404 | A | * | 3/1993 | Wu et al. .................... 257/724 |
| 5,661,901 | A | * | 9/1997 | King ............................ 29/830 |
| 5,789,815 | A | * | 8/1998 | Tessier et al. ............... 257/723 |
| 5,893,726 | A | * | 4/1999 | Farnworth et al. ........... 438/108 |
| 5,918,107 | A | * | 6/1999 | Fogal et al. .................. 438/15 |
| 6,121,070 | A | * | 9/2000 | Akram ....................... 438/108 |
| 6,670,700 | B1 | * | 12/2003 | Hashimoto .................. 257/686 |
| 2001/0006828 | A1 | * | 7/2001 | McMahon |

* cited by examiner

*Primary Examiner*—Ha Tran Nguyen
(74) *Attorney, Agent, or Firm*—Luedeka, Neely, Graham, P.C.

(57) ABSTRACT

A method of assembling at least a first integrated circuit and a second integrated circuit into a multi chip module. The first integrated circuit is attached and electrically connected to a first substrate to form a first assembly, which is tested to ensure that it functions properly. The second integrated circuit is attached and electrically connected to a second substrate to form a second assembly, which is also tested to ensure that it functions properly. The first assembly is attached and electrically connected to the second assembly to form the multi chip module.

19 Claims, 2 Drawing Sheets

MULTI CHIP MODULE ASSEMBLY

FIELD

This invention relates to the field of integrated circuit fabrication. More particularly, this invention relates to packaging materials for integrated circuits.

BACKGROUND

It is often desirable to have two or more different types of integrated circuits packaged together. For example, it is often convenient to have one or more logic integrated circuits, such as an application specific integrated circuits, packaged with one or more memory integrated circuits, such as random access memory and read only memory. In such an arrangement, the memory integrated circuits can conveniently contain information such as operational instructions for the logic integrated circuit and, additionally, other memory integrated circuits can also receive information that is sent from or is to be sent to other circuits. By placing such desired integrated circuits within a single package, a designer can generally increase the speed and reduce the complexity and cost of the overall circuit design. Circuit reliability and tolerance may also increase.

Typically, such a multi chip module is assembled by first placing the various integrated circuits desired on a common package substrate, and then making the electrical connections between the integrated circuits and the package substrate. For example, if the integrated circuits are wire bonded, all of the wire bonds between the package substrate and the integrated circuits are made. More typically, however, the integrated circuits are flip chips, and the electrical connections are made by reflowing the solder bumps between the integrated circuits and the multi chip module package substrate, and then under filling the space between the integrated circuits and the package substrate. The module with the attached integrated circuits is then tested to ensure that the electrical connections were properly made to each integrated circuit, that neither the integrated circuits nor the substrate were damaged during the process, and that the multi chip module functions properly as a whole.

Although all of the components in the operation described above may have been tested prior to the described assembly, sometimes a failure is detected in the assembled module. For example, even though all of the integrated circuits may have been tested prior to assembly, and the package substrate is tested prior to assembly, and all of the components passed the testing, sometimes the assembled multi chip module does not function properly. Because all of the integrated circuits have already been attached to the package substrate prior to the time at which the testing is performed, if the multi chip module does not function properly, the entire module typically must be scrapped, even if the problem is with only one of the integrated circuits. Thus, one or more good integrated circuits may need to be scrapped just because a single integrated circuit is not functional, or has not been properly attached to the package substrate. This, of course, adds undesirable and unnecessary expense to the overall cost of the module fabrication.

What is needed, therefore, is a system by which the failure of an individual integrated circuit does not require the scrap of other, functional integrated circuits.

SUMMARY

The above and other needs are met by a method of assembling at least a first integrated circuit and a second integrated circuit into a multi chip module. The first integrated circuit is attached and electrically connected to a first substrate to form a first assembly, which is tested to ensure that it functions properly. The second integrated circuit is attached and electrically connected to a second substrate to form a second assembly, which is also tested to ensure that it functions properly. The first assembly is attached and electrically connected to the second assembly to form the multi chip module.

In this manner, the integrated circuits are attached to separate substrates and tested to ensure that they function properly before they are electrically connected one to the other by attaching the one substrate to the other. Thus, if one or the other of the integrated circuits is damaged during the attachment processes, or otherwise fails the functional test on its substrate, it can be either reworked or scrapped and replaced with a functional assembly prior to being attached to the other substrate of the other integrated circuit. Therefore, only the failing integrated circuit needs to be scrapped when this method is used, and functional integrated circuits are not wasted in the packaging process.

In various preferred embodiments, the multi chip module is final tested to ensure that it functions properly. Preferably, the first integrated circuit and the second integrated circuit on the multi chip module are enclosed, such as with an encapsulant or a lid. Electrical contacts are also preferably attached to the multi chip module, such as solder balls in a ball grid array. Preferably, the first integrated circuit is a memory integrated circuit, the first substrate is a flex circuit, the second integrated circuit is a logic integrated circuit, such as an application specific integrated circuit, and the second substrate is a build up substrate.

Most preferably the first integrated circuit and the second integrated circuit are both flip chips, and the step of attaching and electrically connecting the first and second integrated circuits to the first and second substrates comprises reflowing solder bumps between the integrated circuits and the substrates, and under filling the integrated circuits. Additional integrated circuits are preferably attached and electrically connected to additional substrates to form additional assemblies, which are then tested to ensure that they function properly, and attached and electrically connected to the second assembly to form the multi chip module.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
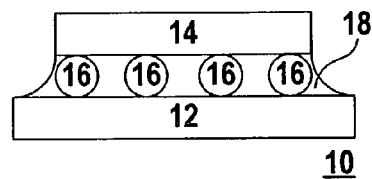
FIG. 1 is a cross sectional view of a first integrated circuit attached and electrically connected to a first substrate, to form a first assembly.

With reference now to FIG. 1, there is depicted a cross sectional view of a first integrated circuit 14 attached and electrically connected to a first substrate 12, to form a first assembly 10. The first integrated circuit 14 may be any one of a number of different kinds of integrated circuits, but in the preferred embodiment the first integrated circuit 14 is a memory device. The first integrated circuit 14 may be wire bonded to the first substrate 12, but in the preferred embodiment the first integrated circuit 14 is a flip chip that is attached and electrically connected to the first substrate 12 such as by solder bumps 16, which are reflowed to provide physical and electrical connections between the first integrated circuit 14 and the first substrate 12. Most preferably, the space between the first integrated circuit 14 and the first substrate 12 is under filled with a compound 18. The first substrate 12 is most preferably a flex circuit substrate.

After the first assembly 10 is formed, it is preferably tested to ensure that it is functional. If the first assembly 10 is found to be functional, it is passed on to further processing as described below. If the first assembly 10 is found to not be functional, then it is either reworked to be functional, if possible, or scrapped.

Figure 2:
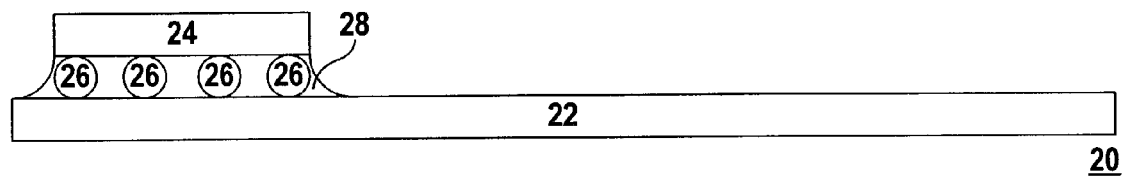
FIG. 2 is a cross sectional view of a second integrated circuit attached and electrically connected to a second substrate, to form a second assembly.

With reference now to FIG. 2, there is depicted a cross sectional view of a second integrated circuit 24 attached and electrically connected to a second substrate 22, to form a second assembly 20. The second integrated circuit 24 may be any one of a number of different kinds of integrated circuits, but in the preferred embodiment, the second integrated circuit 24 is a logic device, such as an application specific integrated circuit. The second integrated circuit 24 may be wire bonded to the second substrate 22, but in the preferred embodiment, the second integrated circuit 24 is a flip chip that is attached and electrically connected to the second substrate 22 such as by solder bumps 26, which are reflowed to provide physical and electrical connections between the second integrated circuit 24 and the second substrate 22. Most preferably, the space between the second integrated circuit 24 and the substrate 22 is under filled with a compound 28. The second substrate 22 is most preferably a build up substrate.

After the second assembly 20 is formed, it is preferably tested to ensure that it is functional. If the second assembly 20 is found to be functional, it is passed on to further processing as described below. If the second assembly 20 is found to not be functional, then it is either reworked to be functional, if possible, or scrapped.

Figure 3:
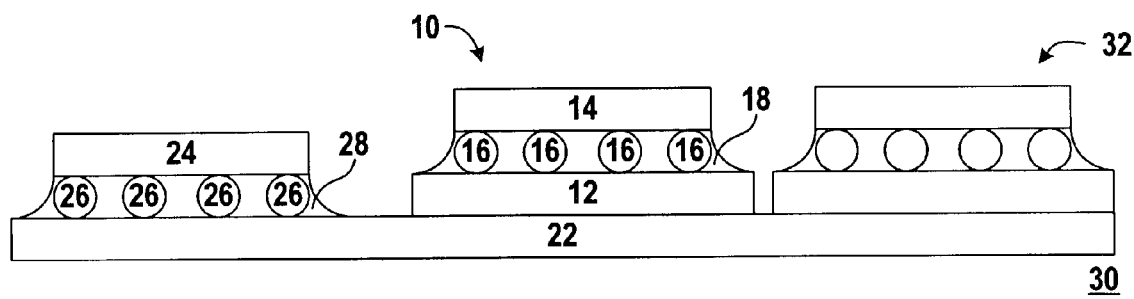
FIG. 3 is a cross sectional view of a first assembly and an additional assembly attached and electrically connected to a second assembly, to form a multi chip module.

First assemblies 10 that have passed functional testing are then combined with second assemblies 20 that have also passed functional testing, to form multi chip modules 30 as depicted in FIG. 3. Most preferably, the first substrate 12 of the first assembly 10 is attached and electrically connected to the second substrate 22 of the second assembly 20. Such an attachment and electrical connection process typically has a lower rate of failures than the attachment process of an integrated circuit to a substrate, and thus it is anticipated that there would be a lower scrap rate as a result of such a process.

Thus, since it is known at this point in the processing that both the first integrated circuit 14 and the second integrated circuit 24 function properly as mounted on the first substrate 12 and the second substrate 22, respectively, there is a high yield of functional assembled multi chip modules 30. Thus, individually failing first assemblies 10 and individually failing second assemblies 20 may be scrapped or reworked as necessary prior to assembly of the multi chip module 30, but substantially all of the multi chip module assemblies 30 are functional and, therefore, good integrated circuits do not need to be scrapped because they are mounted in a multi chip module with a bad integrated circuit. FIG. 3 also depicts an additional assembly 32 that has been mounted to the second substrate 22, in preferably the same manner as that described above for the first assembly 10. Thus, many such assemblies may be mounted to a common substrate 22, where it is known that each of the assemblies is functional before they are all attached one to the other.

Figure 4:
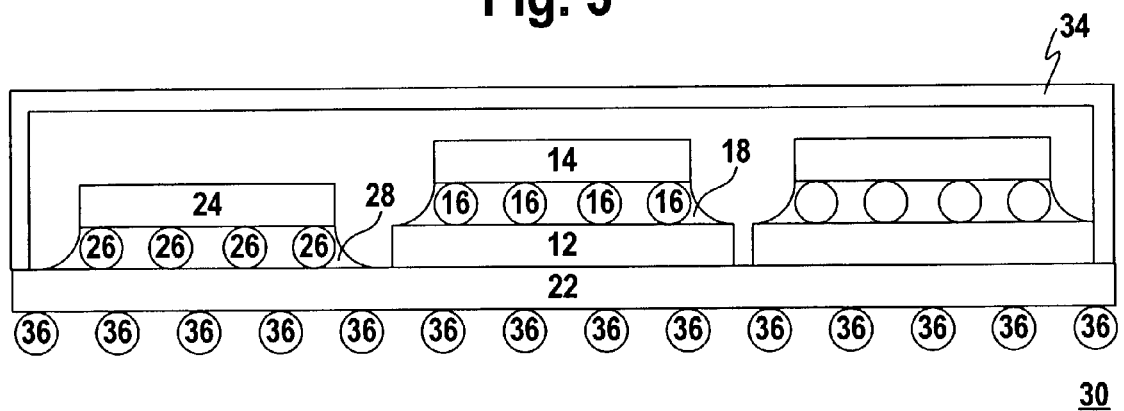
FIG. 4 is a cross sectional view of a multi chip module with a lid and electrical contacts.

FIG. 4 depicts a cross sectional view of the multi chip module 30 that has been covered, as represented by the lid 34. It is appreciated that the multi chip module 30 may be covered such as with a potting compound, or in some other manner that is known in the art. The multi chip module has also received electrical contacts 36, such as the solder ball grid array depicted. Most preferably, the completed multi chip module 30 is tested prior to sale or use.

Figure 5:
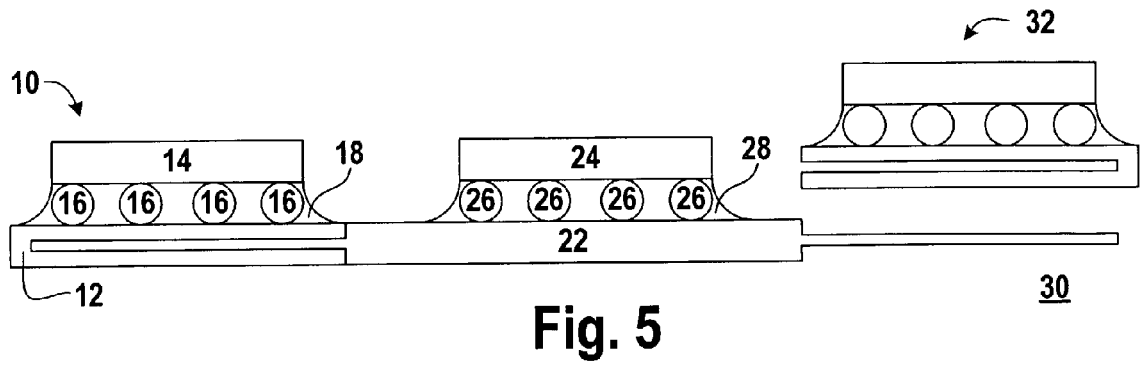
FIG. 5 is a cross sectional view of another embodiment of a first assembly and an additional assembly attached and electrically connected to a second assembly, to form a multi chip module.
Figure 6:
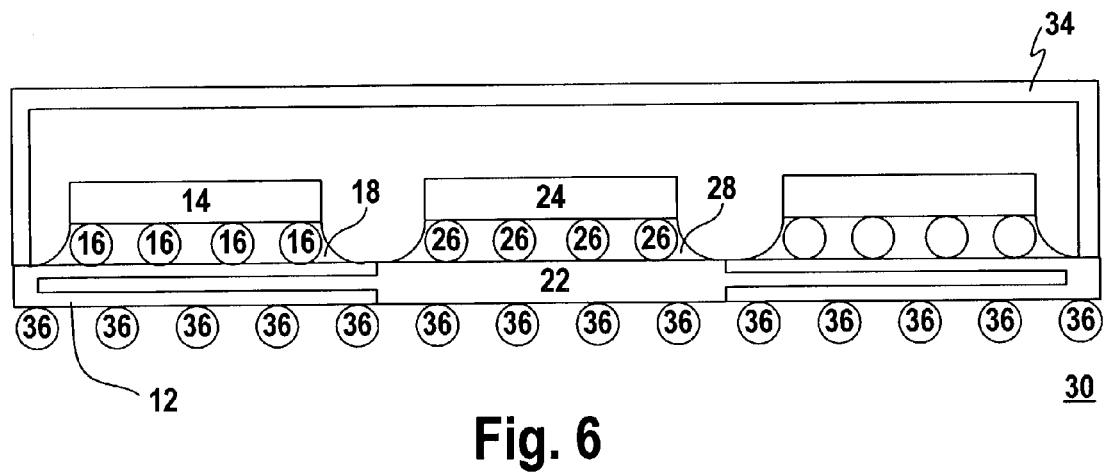
FIG. 6 is a cross sectional view of the embodiment of FIG. 5 with a multi chip module with a first embodiment of a lid and electrical contacts.
Figure 7:
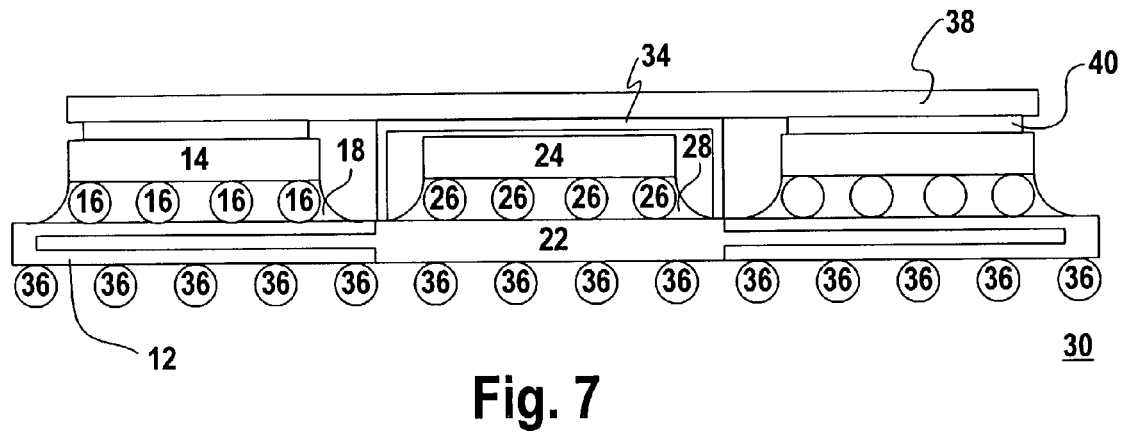
FIG. 7 is a cross sectional view of the embodiment of FIG. 5 with a multi chip module with a second embodiment of a lid and electrical contacts.

FIG. 5 depicts another embodiment of the first substrate 12 and common substrate 22, where the first substrate 12 slots onto the common substrate 22 and thereby makes electrical connections with the common substrate 22. As depicted in FIG. 5, one or more of the first substrates 12 can be slotted onto the common substrate 22 in this manner. FIG. 6 depicts a first embodiment of the lid 34, which covers all of the multi chip module 30. FIG. 7 depicts a second embodiment where the lid 34 covers just the portion of the multi chip module 30 that is mounted directed to the common substrate 22, with a common heat spreader 38 covering all of the components on the multi chip module 30. Elements 40 conduct heat from the integrated circuits 14 to the common heat spreader 38. The integrated circuits 14 may also be individually encapsulated with a lid. Most preferably there is also some type of heat transfer media between the integrated circuit 24 and the lid 34 and the common heat spreader 28.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of assembling at least a first integrated circuit and a second integrated circuit into a multi chip module, the method comprising the steps of:

attaching and electrically connecting the first integrated circuit to a first substrate to form a first assembly, testing the first assembly to ensure that it functions properly, attaching and electrically connecting the second integrated circuit to a second substrate to form a second assembly, testing the second assembly to ensure that it functions properly, and attaching and electrically connecting the first substrate to the second substrate to form the multi chip module, where the first substrate is attached and electrically connected to the second substrate by slotting the first substrate onto the second substrate, where the first substrate forms a horizontal slot that is bounded above by an upper surface of the first substrate and bounded below by a lower surface of the first substrate, and the slot receives a thinned portion of the second substrate, thereby creating electrical connections between the first substrate and the second substrate when the thinned portion of the second substrate is completely inserted into the slot of the first substrate, and the first substrate and the second substrate are disposed within a substantially common plane.

2. The method of claim 1, further comprising the step of enclosing the first integrated circuit and the second integrated circuit on the multi chip module.

3. The method of claim 1, further comprising the step of attaching electrical contacts to the multi chip module.

4. The method of claim 3, wherein the electrical contacts comprise solder balls in a ball grid array.

5. The method of claim 1, wherein the first integrated circuit is a memory integrated circuit.

6. The method of claim 1, wherein the first substrate is a flex circuit.

7. The method of claim 1, wherein the second integrated circuit is a logic integrated circuit.

8. The method of claim 1, wherein the second integrated circuit is an application specific integrated circuit.

9. The method of claim 1, wherein the second substrate is a build up substrate.

10. The method of claim 1, wherein the first integrated circuit and the second integrated circuit are both flip chips.

11. The method of claim 1, wherein the step of attaching and electrically connecting the first integrated circuit to the first substrate comprises reflowing solder bumps between the first integrated circuit and the first substrate, and under filling the first integrated circuit.

12. The method of claim 1, wherein the step of attaching and electrically connecting the second integrated circuit to the second substrate comprises reflowing solder bumps between the second integrated circuit and the second substrate, and under filling the second integrated circuit.

13. The method of claim 1, wherein the step of testing the first assembly to ensure that it functions properly comprises reworking the first assembly so that it passes testing in the case where the first assembly does not function properly.

14. The method of claim 1, wherein the step of testing the first assembly to ensure that it functions properly comprises replacing the first assembly so that it passes testing in the case where the first assembly does not function properly.

15. The method of claim 1, wherein the step of testing the second assembly to ensure that it functions properly comprises reworking the second assembly so that it passes testing in the case where the second assembly does not function properly.

16. The method of claim 1, wherein the step of testing the second assembly to ensure that it functions properly comprises replacing the second assembly so that it passes testing in the case where the second assembly does not function properly.

17. The method of claim 1, further comprising the steps of:

attaching and electrically connecting additional integrated circuits to additional substrates to form additional assemblies, testing the additional assemblies to ensure that they function properly, and attaching and electrically connecting the additional assemblies that function properly to the second assembly to form the multi chip module.

18. A method of assembling at least a first integrated circuit and a second integrated circuit into a multi chip module, the method comprising the steps of:

attaching and electrically connecting the first integrated circuit to a first substrate to form a first assembly, testing the first assembly to ensure that it functions properly, attaching and electrically connecting the second integrated circuit to a second substrate to form a second assembly, testing the second assembly to ensure that it functions properly, attaching and electrically connecting additional integrated circuits to additional substrates to form additional assemblies, testing the additional assemblies to ensure that they function properly, attaching and electrically connecting the first substrate to the second substrate, where the first substrate is attached and electrically connected to the second substrate by slotting the first substrate onto the second substrate, where the first substrate forms a horizontal slot that is bounded above by an upper surface of the first substrate and bounded below by a lower surface of the first substrate, and the slot receives a thinned portion of the second substrate, thereby creating electrical connections between the first substrate and the second substrate when the thinned portion of the second substrate is completely inserted into the slot of the first substrate, and the first substrate and the second substrate are disposed within a substantially common plane, attaching and electrically connecting the additional assemblies that function properly to the second assembly to form the multi chip module, and testing the multi chip module to ensure that it functions properly.

19. A method of assembling at least a flip chip memory integrated circuit and a flip chip application specific integrated circuit into a multi chip module, the method comprising the steps of:

attaching and electrically connecting the memory integrated circuit to a flex substrate to form a first assembly by reflowing solder bumps between the memory integrated circuit and the flex substrate, and under filling the memory integrated circuit, testing the first assembly to ensure that it functions properly, when the first assembly does not function properly, then selectively reworking the first assembly so that it passes testing, and selectively replacing the first assembly with a replacement first assembly that passes testing,
attaching and electrically connecting the application specific integrated circuit to a build up substrate to form a second assembly by reflowing solder bumps between the application specific integrated circuit and the build up substrate, and under filling the application specific integrated circuit,
testing the second assembly to ensure that it functions properly,
when the second assembly does not function properly, then
  selectively reworking the second assembly so that it passes testing, and
  selectively replacing the second assembly with a replacement second assembly that passes testing, and
attaching and electrically connecting the flex substrate to the build up substrate to form the multi chip module, where the flex substrate is attached and electrically connected to the build up substrate by slotting the flex substrate onto the build up substrate, where the flex substrate forms a horizontal slot that is bounded above by an upper surface of the flex substrate and bounded below by a lower surface of the flex substrate, and the slot receives a thinned portion of the build up substrate, thereby creating electrical connections between the flex substrate and the build up substrate when the thinned portion of the build up substrate is completely inserted into the slot of the flex substrate, and the flexible substrate and the build up substrate are disposed within a substantially common plane.

* * * * *